(12) United States Patent
Klöppel et al.

(10) Patent No.: US 6,849,165 B2
(45) Date of Patent: Feb. 1, 2005

(54) INDIUM-TIN OXIDE (ITO) LAYER AND METHOD FOR PRODUCING THE SAME

(75) Inventors: Andreas Klöppel, Glauburg (DE); Jutta Trube, Mombris (DE)

(73) Assignee: Unaxis Deutschland GmbH, Hanau (DE)

( * ) Notice: Subject to any disclaimer, the term of this patent is extended or adjusted under 35 U.S.C. 154(b) by 0 days.

(21) Appl. No.: 10/276,202

(22) PCT Filed: May 4, 2001

(86) PCT No.: PCT/EP01/05060
§ 371 (c)(1),
(2), (4) Date: May 1, 2003

(87) PCT Pub. No.: WO01/86731
PCT Pub. Date: Nov. 15, 2001

(65) Prior Publication Data
US 2003/0170449 A1 Sep. 11, 2003

(30) Foreign Application Priority Data
Mar. 12, 2000 (DE) ......................... 100 23 459

(51) Int. Cl.$^7$ .............................................. C23C 14/34
(52) U.S. Cl. ........................... 204/192.15; 204/192.22; 204/192.26
(58) Field of Search ....................... 204/192.15, 192.22, 204/192.26

(56) References Cited

FOREIGN PATENT DOCUMENTS

| JP | 02054755 | 2/1990 | ............ C23C/14/08 |
| JP | 05239635 | 9/1993 | ............ C23C/14/34 |
| JP | 09293693 | 11/1997 | ......... H01L/21/285 |

OTHER PUBLICATIONS

"Effect of Hydrogen Partial Pressure on Optoelectronic Properties of Indium Tin Oxide Thin Films Deposited by Radio Frequency Magnetron Sputtering Method" by K. Zhang et al., *Journal of Applied Physics.*, vol. 86, No. 2, Jul. 15, 1999, pp. 974–980.

"Effect of Process Parameters on characteristics on Indium Tin Oxide Thin Film for Flat Panel Display Application" by H.L. Byung et al. Thin Solid Films, Elsevier–Sequoia S.A., Lausanne, CH, vol. 302, No. 1–2, Jun. 20, 1997, pp. 25–30.

"Low Resistivity Indium–Tin Oxide Transparent Conductive Films. I. Effect on Introducing H20 Gas or H2 Gas During Direct Current Magnetron Sputtering" by S. Ishibashi et al., Journal of Vacuum Science and Technology: Part A, American Institute of Physics, vol. 8, No. 3, Part 1, May 1990, pp 1399–1402.

"Indium Thin Oxide Films Prepared by Radio Frequency Magnetron Sputering Method at a Low Processing Temperature" by K. Zhang et al., Thin Solid Films, Elsevier–Sequoia S.A., Lausane, CH, vol. 376, No. 1–2, Nov. 1, 2000, pp 255–263.

"DC Magnetron Reactively Sputtered Indium–Tin–Oxide Films Produced Using Argon–Oxygen–Hydrogen Mixtures" by G.L. Harding et al., Solar Energy Materials, Elsevier Science Publishers B.V., Amsterdam, NL, Nos. 5/6, pp. 367–379.

"Electrical Characterization of ITO/p–InP Solar Cells", by Z.A. Shi et al., $23^{rd}$ IEEE Photovoltaic Specilists Conference, May 14, 1993, pp. 1432–1436.

"Optimized Indium Tin Oxide Contact for Organic Light Emitting Diode Applications" by F. Zhu et al., Thin solid Films, Elsevier–Sequoia S.A., Lausanne, CH, 2000, No. 1/2, pp. 314–317.

*Primary Examiner*—Steven Versteeg
(74) *Attorney, Agent, or Firm*—Sheridan Ross PC

(57) ABSTRACT

A process for the deposition of transparent and conductive indium-tin oxide (ITO) films with a particularly low resistance of preferably less than 200 $\mu\Omega$cm and a small surface roughness of preferably less than 1 nm on a substrate, wherein combined HF/DC sputtering of an indium-tin oxide (ITO) target is employed and wherein the process gas is supplemented by an argon/hydrogen mixture as reaction gas during the sputtering, as well as ITO-films with the above-named characteristics.

18 Claims, 2 Drawing Sheets

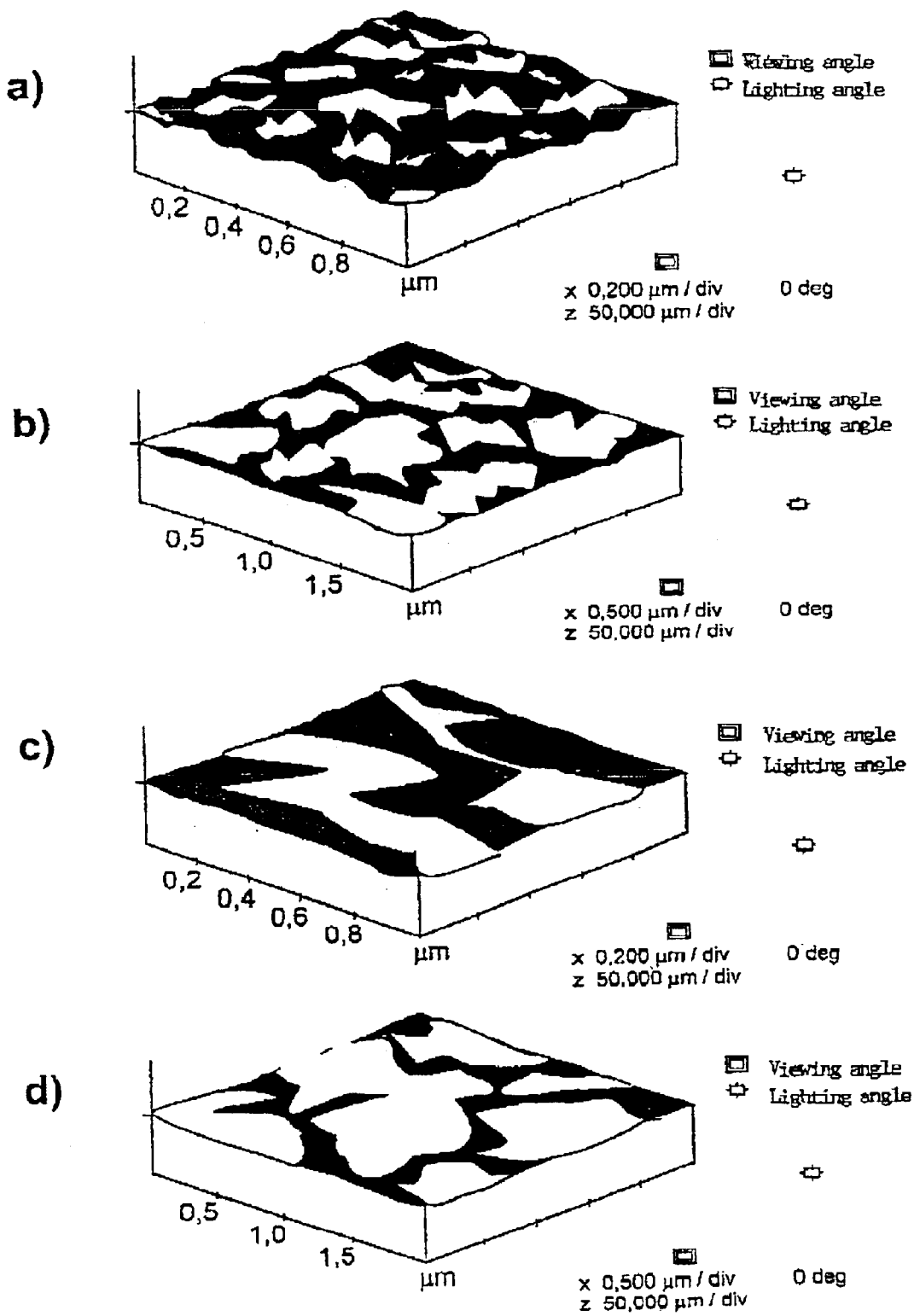

INDIUM-TIN OXIDE (ITO) LAYER AND METHOD FOR PRODUCING THE SAME

Figure 1:
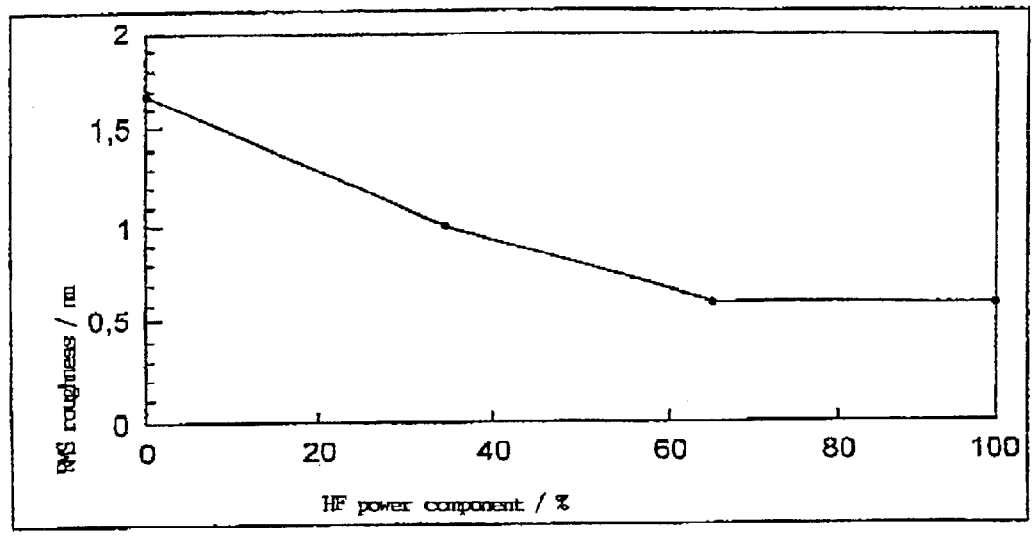

The present invention concerns an indium-tin oxide (ITO) film for use as a transparent, conductive electrode, especially with organic LED displays, as well as a process for the deposition of transparent and conducting indium-tin oxide (ITO) films on a substrate.

Transparent and conductive electrode films are needed for flat monitors and screens, as are used—for example—in portable computers or displays for mobile telephones, as—for example—liquid crystal displays, organic LED displays, TET screens, etc. For this purpose it is a common practice to use indium-tin oxide films (ITO films), since they best satisfy the requirements as far as conductivity and transmission properties are concerned. It is customary for these ITO films to be applied to transparent substrate materials, especially glass, transparent plastics, combined glass-plastic laminates, etc., by sputter deposition (cathode atomization) of an ITO target.

In "Low Resistivity Indium-Tin Oxide Transparent Conductive Films, I. Effect Of Introducing $H_2O$-Gas During Direct Current Magnetron Sputtering". J.Vac. Sci. Technol. A 8(3) May/June 1990, Ishibashi et al. describe a direct current (DC) magnetron-sputter process in which the addition to the process gas of water vapour or hydrogen makes it possible to deposit an ITO film at a deposition temperature of less than 200° C., this film having a specific resistance of about $6 \times 10^{-4}$ $\Omega$cm. The low deposition temperature and/or substrate temperature of less than 200° C. is particularly important in this connection, because at higher deposition or substrate temperatures, even though the sputter process will lead more readily to the desired results, it could well damage both the deposited film and the substrate. This is particularly important, for example, when plastic substrates are used, polyethylene terephthalate (PET) being a case in point, which would be destroyed at higher temperatures.

Another process for the deposition of low-resistance ITO films is described by H. Lee et al. in "Effect Of Base Pressure in Sputter Deposition on Characteristics of Indium Tin Oxide Thin Film", Flat Panel Display Materials II, Symposium San Francisco, Calif., USA, 8 to 12 April 1996, Mat. Res. Soc. Symp. Proc. Vol. 424, 1997. The process in question is a combined radio-frequency (RF) and DC-magnetron sputter process and is used to vaporize an ITO target with equal shares of DC sputtering and RF-sputtering and to deposit a film with a specific resistance of less than $1.5 \times 10-4$ $\mu\Omega$cm. The process gas used in this case was argon.

Although the films produced by means of the above processes are all characterized by a low specific resistance, they also have the drawback of being associated with a substantial surface roughness. In particular, the surface structure of such ITO films is characterized by a domain structure with grains of different crystal orientation within the domains, where individual grains have tips that project from the surface (so-called spikes). The rough surface and the so-called ITO spikes have the effect that when the ITO film is used as electrode, the spikes act as field peaks and will therefore reduce the useful life of, for example, organic LED cells when such ITO films are used with organic LED displays. Furthermore, the enhanced surface roughness leads to a reduced efficiency of such organic LED sells. Another disadvantage has to be seen in the fact that in the production of organic LED displays it is quite possible that the organic materials deposited on the ITO film will not cover the spikes, which may therefore create short circuits during subsequent use.

The present invention therefore sets out to make available ITO films and a process for the deposition of ITO films that will make it possible to produce ITO films with a small surface roughness, preferably less than 1 run, and a low specific resistance, preferably less than 200 $\mu\Omega$cm, and where the deposition temperature and/or the temperature of the substrate on which the ITO films are to be deposited is to be low, especially less than 250° C., and preferably less than 200° C. In particular, it is proposed to provide a process and appropriate ITO films suitable for industrial use, i.e. capable of being realized in a simple manner and at a reasonable cost, that will especially avoid the so-called ITO spikes.

This task is absolved by means of the process in accordance with one embodiment of the present invention, and the ITO film in accordance with another embodiment of the present invention. Further advantageous embodiments are also described.

The process for the deposition of transparent and conductive indium-tin oxide (ITO) films in accordance with the invention, which gives rise, in particular, to films with a low specific resistance and a very smooth surface, comprises a combined high-frequency/direct current (HF/DC) sputter process in an atmosphere that utilizes an argon/hydrogen mixture as reaction gas. When the HF power component used for the sputtering is in the high-frequency range, which is known to a person skilled in the art, the chosen reaction gas mixture of argon and hydrogen becomes activated in the HF plasma and this has positive effects on the deposited ITO film. In particular, both the surface roughness and the specific resistance of the film are clearly reduced, while the substrate temperature can be kept at a low value of less than 250° C., preferably $\leq$200° C. Due to their lesser surface roughness the use of films deposited in this manner for organic LED cells makes it possible to obtain a greater efficiency, a greater yield and a longer useful life for organic LED displays. Furthermore, the reduction of the specific resistance has the effect that a smaller film thickness may be chosen for certain applications in which the ITO film has to possess a predetermined resistance per unit area, so that the necessary film can be produced with a smaller quantity of indium-tin oxide material.

For the sputtering it is customary to use known ITO targets that preferably comprise 90% of indium oxide ($In_2O_3$) and 10% of tin oxide ($SnO_2$). The HF power component is preferably set to at least 30%, especially 60% and over, where preferred combinations will have an HF power component in the range between 40 and 90%, especially HF power components between 60 and 80%.

The argon-hydrogen mixture added to the process gas in accordance with the invention will preferably have a mixing ratio of 80% argon and 20% hydrogen. Advantageously, such an argon/hydrogen mixture is added to the process gas, which usually consists of argon, in the range between 0.1 and 30%, especially between 5 and 15%, but preferably between 8 and 10%.

For the deposition of ITO films the overall pressure of the process gas may also play an important part. Here it has been found that particularly good results are obtained when the total pressure is in the range between 0.5 and 5 $\mu$bar, preferably between 1 and 3 $\mu$bar and even more preferably between 1.5 and 2 $\mu$bar.

In a preferred embodiment, to be chosen particularly when ITO films are deposited on plastic materials, the substrate temperature during the deposition of the ITO film is set to not more than 250° C., preferably $\leq$200° C. This has the advantage that neither the substrate nor the film itself will be damaged due to an excessive temperature.

Although the described process is not limited to the use of magnetron sputter plants, the sputter deposition will preferably be supported by an appropriate magnetron arrangement, The ITO films in accordance with the invention, especially those produced by means of the process described above, have a smooth surface with a surface roughness of less than 1 nm and a specific resistance that amounts to less than 200 $\mu\Omega$cm, especially a resistance in the range between 140 and 160 $\mu\Omega$cm.

Further advantages, features and characteristics of the invention will be brought out by the detailed description about to be given of some preferred embodiments. To this end the diagramme reproduced in FIG. 1 illustrates the dependency of the surface roughness (RMS roughness) of ITO films on the IV component during deposition with a power density of P=2 W/cm$^2$ and a substrate temperature of T$_{sub}$=200° C., and the diagramme of FIG. 2 illustrates the dependency of the specific resistance $\rho$ of ITO films on the HF component during deposition with a power density of P=2 W/cm$^2$ and a substrate temperature of T$_{sub}$=200° C., while FIG. 3 shows raster scan microscope (AFM) photographs at a magnification of 60,000× of ITO films that were deposited with different HF power components at a substrate temperature of T$_{sub}$=200° C.

a: exclusively DC spattering,
b: 33% H component during HF/DC sputtering,
c: 66% HF component during HF/DC sputtering, and
d: exclusively HF sputtering.

FIG. 1 illustrates the dependency of the surface roughness on the HF power component during ITO film deposition in accordance with the invention. As the HF component of the combined HF/DC sputter increases, the surface of the film becomes increasingly smooth. Especially as from an HF component of about 30% onwards, one can note a significant reduction of the surface roughness. As from an HF component of about 65% onwards, however, a saturation effect makes itself felt as regards this influence on the surface roughness.

Figure 2:
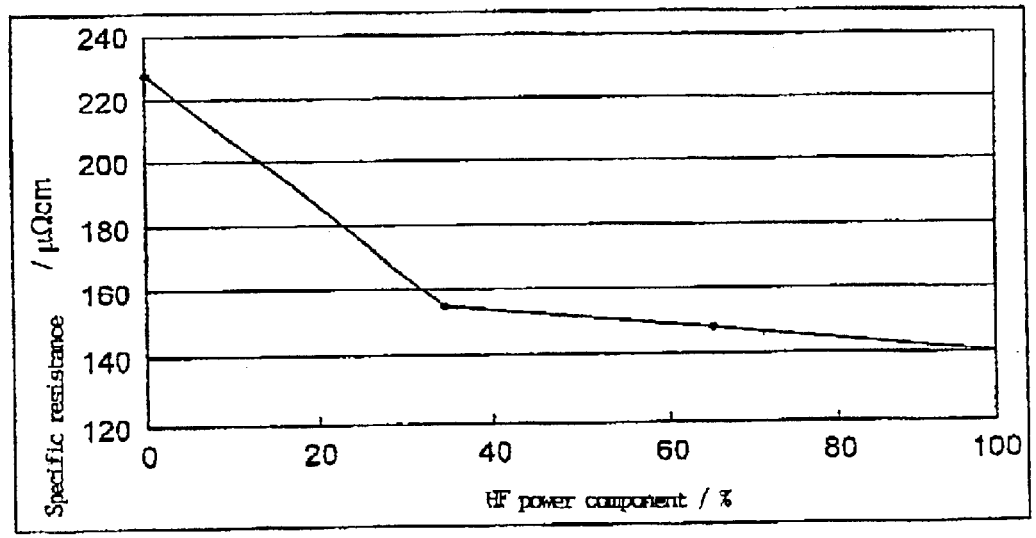

FIG. 2 illustrates the dependency of the specific resistance $\rho$ of ITO films that were deposited with increasing HF power components. Here one can note once again that the specific resistance diminishes as the HF power component increases. A particularly clear reduction can be noted up to an HF component of about 30%, but from that point onwards any further increase of the HF component produces only a slight but continuous reduction of the specific resistance.

FIG. 3 illustrates the influence of the HF power component during combined HF/DC sputtering on the surfaces of ITO films that were deposited at substrate temperatures of 200° C.

At a magnification of 60,000×, the various AFM photographs of FIG. 3 show ITO films that were deposited exclusively by means of DC sputtering (a), by means of combined HF/DC sputtering with an HF component of 33% (b) and with an HF component of 66% (c), and exclusively by means of HF sputterng (d). The AFM photographs clearly show that a clearly smoother surface structure can be obtained as the HF power component increases, and that the surface roughness attains an optimum at an HF component of 66%.

In a preferred embodiment an ITO film in accordance with the invention was deposited on float glass with the following parameters:

Target: ITO-Mitsui (90% indium oxide/10% tin oxide)
Purity: 4N$_2$ density >98%
Total sputtering power: 860 W (570 W HF/290 W DC)
HF power component: 66%
Process pressure: 1.5 $\mu$mbar, argon/hydrogen share (80%/20% mixture): 8%
Deposition temperature: 200° C.
Magnetic field strength: 1200 G
Substrate: Float glass
Film thickness: 72 nm In the case of an ITO film deposited with the above parameters by means of magnetron sputtering the RMS roughness as ascertained by means of AFM (raster screen microscope) was found to be 0.623 mn. The RMS (root mean square roughness) is defined as the standard deviation of the values of z (film thickness) determined by measurement with the raster screen microscope. The specific resistance of the film amounted to 152 $\mu\Omega$cm. The transmission at a wave length of 550 nm amounted to 81% of the reference medium air.

These result show that the process described above makes it possible to produce ITO films in accordance with the invention that, especially as gar as surface roughness and specific resistance are concerned, have excellent properties for use in organic LED displays.

What is claimed is:

1. A process for the deposition of transparent and conductive indium-tin oxide (ITO) films with a particularly low resistance and a small surface roughness on a substrate, comprising:

providing a substrate;
combined HF/DC sputtering of an indium-tin oxide (ITO) target to deposit an ITO film onto the substrate, wherein a process gas is supplemented by an argon/hydrogen mixture as reaction gas during the sputtering and wherein the ITO film has a resistance of less than 200 $\mu\Omega$cm and a surface roughness of less than 1 nm.

2. A process in accordance with claim 1, wherein the HF power component during the sputtering accounts for at least 30% of the total power.

3. The process in accordance with claim 2, wherein the HF power component during the sputtering accounts for 60% or more of the total power.

4. The process in accordance with claim 2, wherein the HF power component during the sputtering accounts for 40 to 90% of the total power.

5. A process in accordance with claim 2, wherein the pressure of the process gas during sputtering amounts to between 1.5 to 3 $\mu$mbar.

6. A process in accordance with claim 2, wherein the substrate temperature during deposition of the ITO film does not exceed 200° C.

7. A process in accordance with claim 1, wherein the mixing ratio of the argon/hydrogen mixture amounts to 80/20 and the argon/hydrogen mixture constitutes 0.1 to 30% of the process gas.

8. A process in accordance with claim 7, wherein the argon/hydrogen mixture constitutes 5 to 15% of the process gas.

9. A process in accordance with claim 7, wherein the pressure of the process gas during sputtering amounts to between 1.5 and 3 $\mu$mbar.

10. A process in accordance with claims 7, wherein the substrate temperature during deposition of the ITO film does not exceed 200° C.

11. A process in accordance with claim 1, wherein the pressure of the process gas during sputtering amounts to between 0.5 and 5 $\mu$bar.

12. A process in accordance with claim 11, wherein the argon/hydrogen mixture constitutes 5 to 15% of the process gas.

13. A process in accordance with claim 11, wherein the substrate temperature during deposition of the ITO film does not exceed 200° C.

14. A process in accordance with claim 1, wherein the substrate temperature during deposition of the ITO film does not exceed 250° C.

15. A process in accordance with claim 1, wherein magnetron sputtering is used for sputtering.

16. The process in accordance with claim 1, wherein the HF power component during the sputtering accounts for 60% or more of the total power.

17. The process in accordance with claim 1, wherein the HF power component during the sputtering accounts for 40 to 90% of the total power.

18. A process in accordance with claim 1, wherein the mixing ratio of the argon/hydrogen mixture amounts to 80/20 and the argon/hydrogen mixture constitutes 8 to 10% of the process gas.

* * * * *